United States Patent [19]

Kimura

[11] Patent Number: 5,045,505
[45] Date of Patent: Sep. 3, 1991

[54] METHOD OF PROCESSING SUBSTRATE FOR A BEVELED SEMICONDUCTOR DEVICE

[75] Inventor: Hirokazu Kimura, Joetsu, Japan

[73] Assignees: Shin-Etsu Handotai Co., Ltd., Tokyo; Naoetsu Electronics Company, Niigata, both of Japan

[21] Appl. No.: 512,409

[22] Filed: Apr. 23, 1990

[30] Foreign Application Priority Data

Apr. 28, 1989 [JP] Japan .................................. 1-111372

[51] Int. Cl.$^5$ .......................................... H01L 21/461
[52] U.S. Cl. .................................... 437/249; 137/225; 137/6; 148/33.2; 148/DIG. 161; 51/325
[58] Field of Search ........................... 437/6, 249, 225; 148/33.2; 156/645; 51/325; 357/55

[56] References Cited

U.S. PATENT DOCUMENTS

| | | | |
|---|---|---|---|
| 3,015,590 | 1/1962 | Fuller | 437/249 |
| 3,742,593 | 7/1973 | Smith | 437/6 |
| 4,630,093 | 12/1986 | Yamaguchi et al. | 437/249 |

FOREIGN PATENT DOCUMENTS

| | | | |
|---|---|---|---|
| 2323613 | 11/1974 | Fed. Rep. of Germany | 357/55 |
| 2358937 | 6/1975 | Fed. Rep. of Germany | 357/55 |
| 2531108 | 7/1983 | France . | |
| 0024571 | 2/1979 | Japan . | |
| 0113332 | 9/1980 | Japan | 156/645 |

OTHER PUBLICATIONS

IEEE Transactions on Electron Devices ED-31 (1984) Jun., No. 6, pp. 733-738, "The Influence of Surface Charge and Bevel Angle on the Blocking Behavior of a High-Voltage p+—n—n+ Device".

"Reduction of Grinding and Lapping Defects", Mendel et al., IBM Technical Disclosure Bulletin, vol. 25, No. 9, Feb. 1983, p. 4761.

Primary Examiner—Brian E. Hearn
Assistant Examiner—Chandra Chaudhari
Attorney, Agent, or Firm—Oliff & Berridge

[57] ABSTRACT

When both main surface sides of a substrate doped with an impurity at a lower concentraiton are subjected to diffusion to form a higher concentrated impurity layer on the surfaces, about a half of the thickness of the substrate is removed to expose a layer doped with the impurity at the lower concentration on one surface of the substrate. Then the exposed lower concentrated impurity layer is polished to provide the substrate for semiconductor device comprising double layers composed of higher and lower concentrated impurities. Beveled portions are formed to have such a peripheral contour of the substrate as a beveled depth of the surface to be removed substantially half the thickness of the substrate is made larger than that of the surface not to be removed of the substrate, and an angle between an inclining surface and a main surface of the beveled portion on the removed surface is made larger than that of the beveled portion of the non-removed surface, before the diffusion to both the surfaces is carried out or after the same has been carried out.

6 Claims, 2 Drawing Sheets

METHOD OF PROCESSING SUBSTRATE FOR A BEVELED SEMICONDUCTOR DEVICE

BACKGROUND OF THE INVENTION

1. Field of the Invention

The present invention relates to a method of processing a substrate for semiconductor device, and more specifically, to a method of beveling the substrate.

2. Description of the Related Art

Conventionally, a substrate for semiconductor device has been beveled so that the circumferential edges of the front and back surfaces thereof is made substantially symmetrical. This beveling process is usually carried out using a diamond grindstone having a U- or V-shaped groove edge provided around the outer circumference thereof in such a manner that the diamond grindstone is brought into contact with the substrate for semiconductor device and they are rotated about axes disposed in parallel each other, and thus the periphery of the substrate for semiconductor device is formed to a wedge-shaped cross section. Since the wedge-shaping is performed by the beveling process, it is called a beveled portion, which is relatively smaller in size in the case of a discrete semiconductor substrate as compared with that of a semiconductor substrate for integrated circuits (IC) and mainly intends to prevent the substrate for semiconductor device from being chipped off while it is handled in the fabrication of IC.

This beveling is usually carried out in the fabricating processes of a substrate for semiconductor device just after a semiconductor monocrystal has been cut or after it has been further subjected to a lapping process. The beveling process is carried out at a relatively earlier stage of the fabricating process of the substrate for semiconductor device, because a grindstone having a grinding layer composed of relatively coarse fixed abrasive grains is used in the process, and thus the substrate is greatly damaged and coarse isolated grains are produced during the beveling process.

A semiconductor discrete device is fabricated by a triple diffusion method, wherein, first, a substrate for semiconductor device cut off from a monocrystal is subjected to a grinding and/or etching process, and the dopant to form a collector region is diffused into the bulk of the substrate through both the surfaces at an elevated temperature. Next, about a half of the thickness of the substrate is ground and removed (hereinafter, referred to as half-off) from only one surface thereof, the inner low concentrated impurity layer (same as the impurity species and concentration of the monocrystal) of the substrate is exposed, the substrate is ground while accurately controlling the thickness (usually, referred to as $x_1$) of the low impurity layer, and further diffusions for base and emitter regions are performed through limited openings on the exposed surface to finally obtain the semiconductor discrete device. Since the beveling process is carried out to the substrate before it is subjected to diffusion or after it has been subjected thereto in the fabricating processes of the semiconductor discrete device, a technical problem arises in a conventional beveling method.

Prior art will be described based on the description of, for example, Japanese Examined Patent Publication No. 60-58579.

FIG. 3 shows a substrate 21 for semiconductor device having unsymmetrical beveled portions 21a and 21b respectively formed on the front and back surfaces thereof. The beveled portions 21a and 21b are formed using a rotary grindstone 22 shown in FIG. 4.

The beveled portion 21a and 21b of the substrate 21 for semiconductor device are arranged as follows. Assuming that the beveled portion 21a on the surface of the substrate from which a diffused layer has been ground and removed (hereinafter, referred to as a front surface) has a beveled width $w_1$ and a beveled depth of $d_1$, and the beveled portion 21b on the back surface has a beveled width $w_2$ and a beveled depth $d_2$, an arrangement is such that $w_1 w_2$, $d_1 d_2$, and the angle $\theta_1$ between the inclining surface and the main surface of the beveled portion 21a of the front surface [$\theta_1 = \arctan(d_1/w_1)$] is equal to the angle $\theta_2$ between the inclining surface and the main surface of the beveled portion 21b of the back surface [$\theta_2 = \arctan(d_2/w_2)$]. Note that, in this case, the beveled width $w_2$ of the beveled portion 21b of the back surface must be set to a prescribed value or a value larger than it to prevent the substrate 21 for semiconductor device from being chipped off through handling.

According to this technology, a part of the beveled portions 21a and 21b is left on the front and back surfaces of the substrate 21 for semiconductor device even after the front and back surfaces of the substrate 21 for semiconductor device have been lapped to the levels $A_1$ and $A_2$ which are shallower than the beveled depths $d_1$ and $d_2$, the front surface has been removed (half-off) to the surface B which is shallower than the beveled depth $d_2$, and then the substrate has been polished, whereby the chip-off of the substrate 21 for semiconductor device can be effectively prevented in the following process.

Nevertheless, the following problems arise in the prior art.

The beveled angle $\theta_1$ of the front surface must be a prescribed value or a value less than it, because the beveled depth $d_1$ of the front surface is made large so that a part of the beveled portion 21a is left after the substrate has been subjected to the half-off and polishing, and further the beveled portion 21b of the back surface has the beveled width $w_2$ which is set to a prescribed value or a value larger than it, as described above. Under these circumstances, if the beveled angle $\theta_1$ of the front surface and the beveled angle $\theta_2$ of the back surface are set to the same value, as described above, the wedge-like periphery of the substrate is made considerably sharp. As a result, the circumferential edge of the substrate 1 for semiconductor device are liable to be chipped off.

Further, according to the substrate 21 for semiconductor device of the above technology, the beveled widths $w_1$ and $w_2$ of both the surfaces must be differently formed, and thus when a substrate 41 for semiconductor device (numeral 41 is used to discriminate this substrate from the substrate 21 for semiconductor device to which the beveled portions 21a and 21b have been formed) is processed to form the beveled portions 21a and 21b, as shown in FIG. 4, in such a manner that they are simultaneously formed by a grindstone 22 having the grinding surface which contour is predetermined to conform with the dimensional requirements of the periphery of the beveled substrate 21 for semiconductor device, the corner of the front surface having the larger beveled width is first abutted against the grinding surface 22a of the grindstone 22. Thereafter, the corner of the back surface having the smaller beveled width is next abutted against the grinding surface 22c of the grindstone 22. As a result, downward pressure from the grinding surface 22a is left not neutralized until after the corner of the front surface has gone toward the grinding surface 22a and the corner of the back surface is abutted against the grinding surface 22c. Therefore, the substrate 21 for semiconductor device is sometimes chipped off while it is in a beveling process.

SUMMARY OF THE INVENTION

It is an object of the present invention, which has been achieved taking into consideration the above problems arisen particularly in a beveling method applied to a substrate for semiconductor device to which collector diffusion has been finished or is not finished, that is, the substrate for a power transistor by so called the triple diffusion method, to provide a method of processing a substrate for semiconductor device capable of effectively preventing the substrate from being chipped off.

Other objects and novel advantages of the present invention will be apparent from the following description and accompanying drawings of this specification.

To achieve the above object, according to one aspect of the present invention, before both surfaces of a substrate for semiconductor device is subjected to diffusion or after they have been subjected thereto, beveled portions are formed to have such a contour of the periphery of the substrate as a beveled depth of the surface to be half-offed (hereinafter, referred to as a front surface) of the substrate is made larger than that of the surface (hereinafter, referred to as a back surface) of the substrate, and an angle between an inclining surface and a main surface of the beveled portion of the front surface is made larger than that of the beveled portion of the back surface.

Further, according to another aspect of the present invention, the respective angles of the substrate mentioned above are set such that the front and back surfaces have substantially the same width.

Further, according to further aspect of the present invention, the beveled portions on the front and back surfaces are simultaneously formed by a grindstone having the grinding surface corresponding to the profile of the periphery of the substrate which is formed after the substrate has been processed.

According to the present invention, since beveled portions are formed to have such a peripheral contour of the substrate as the angle between the inclining surface and the main surface of the beveled portion on the front surface is made larger than that of the beveled portion on the back surface, and a beveled depth of the front surface side is made larger than that of the back side surface, the strength of the circumferential edges is increased, whereby the substrate for semiconductor device is effectively prevented from being chipped off when it is in a beveling process itself. Further, there is an advantage in that when both surfaces of the substrate is successively subjected to diffusion, the occurrence of the chip-off of the substrate is greatly prevented in the handling of the substrate in the diffusion, or in the handling thereof when about a half of the front surface of the substrate is removed.

Furthermore, since the beveled substrate for semiconductor device has the beveled portion properly left after half-off at the circumferential edge of the front surface thereof to prevent the substrate from being chipped off in the following process, the front surface has the same effect as that of the back surface.

Further, since the beveled portions formed on both main surfaces of the substrate have the same beveled width, the beveled portions of the front and back surfaces can be simultaneously formed by a grindstone having the grinding surface corresponding to the profile of the periphery of the substrate which is formed after the substrate has been processed. In this case, since the corners of the front and back surfaces are simultaneously abutted against the grinding surface of the grindstone, whereby the grinding operation of the substrate is simultaneously carried out and finished at both the edges. As a result, while the beveled portions are ground, pressure originated from one of the grinding surfaces being ground is always counterbalanced by that from the other grinding surface being ground, whereby the occurrence of strain due to grinding and the chip-off of the substrate for semiconductor device can be prevented during the operation.

DESCRIPTION OF THE PREFERRED EMBODIMENTS

An example of a method of processing the periphery of a substrate for semiconductor device according to the present invention will be described below with reference to the drawings.

Figure 1:
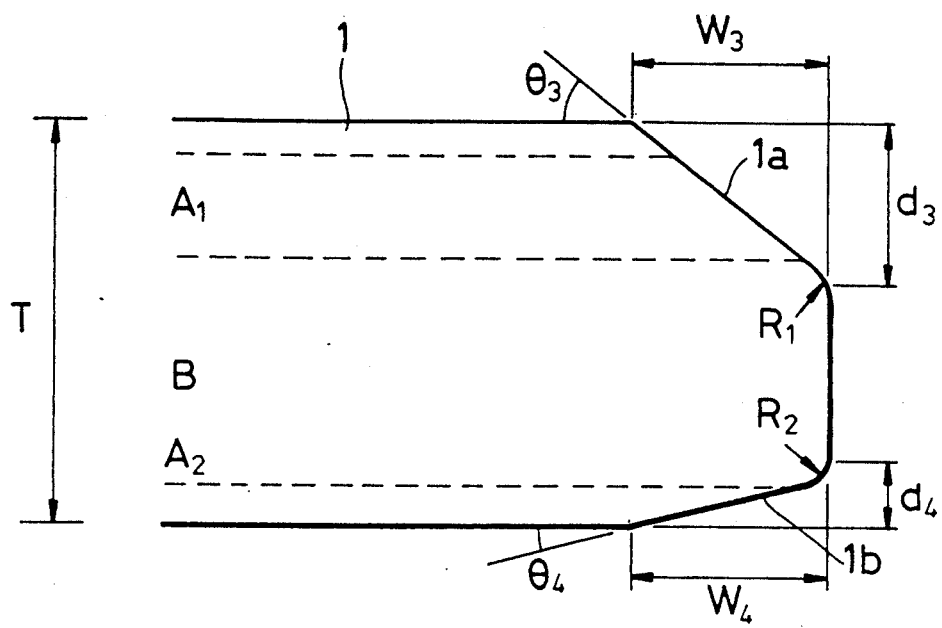
FIG. 1 is a diagram showing the circumferential portion and the vicinity thereof of an embodiment of a substrate for semiconductor device according to the present invention.

FIG. 1 shows the state of the substrate for semiconductor device of the embodiment before it is subjected to a half-off process.

In the figure, numeral 1 designates the substrate for semiconductor device, and beveled portions 1a and 1b are formed around the circumferential edges thereof. The substrate 1 for semiconductor device can be, for example, an intermediate member of a substrate used to form a discrete semiconductor device having the beveled portions 1a and 1b arranged unsymmetrically.

More specifically, in the substrate 1 of this embodiment, the beveled portions 1a and 1b formed around the circumferential edges of the front and back surfaces have the same beveled widths $w_3$ and $w_4$, and the beveled portions 1a and 1b are arranged such that they have different beveled depths $d_3$ and $d_4$. The circumferential edges of the substrate provided with the beveled portions 1a and 1b are rounded with the radii of curvature of R1 and R2, respectively.

These radii of curvature of R1 and R2 are formed simultaneously when the beveling process is carried out or by a mechanical and/or chemical erosion process independently of the beveling process.

More specifically, the beveled depth $d_3$ of the front surface is set to such a value that permits a part of the beveled portion to be left after the substrate has been subjected to lapping, grinding for half-off, or polishing. The beveled depth $d_4$ of the beveled portion $1b$ is set to such a value that permits a part of the beveled portion to be left when it is lapped. On the other hand, the width $w_4$ of the beveled portion $1b$ of the back side is set to a value capable of preventing the chip-off of the substrate 1 or to a value larger than it. The beveled width $w_4$ is finally determined in relation to the beveled depth $d_4$. Further, the front beveled width $w_3$ is made equal to the above beveled width $w_4$. More specifically, they are set such that the beveled angle $\theta_3$ of the front surface [$\theta_3$ = arc tan $(d_3/w_3)$] is larger than the beveled angle $\theta_4$ of the back surface [$\theta_4$ = arc tan $(d_4/w_4)$]. No problem arises even if the beveled angle $\theta_3$ of the front surface is made larger than the beveled angle $\theta_4$ of the back surface, as described above. This is because that since the accuracy of photolithography technology required in the fabricating process of a semiconductor integrated device is not required in the fabricating process of a discrete semiconductor device, it is sufficient only if the beveled portions can prevent the occurrence of chip-off due to a mechanical shock mainly caused in the fabricating process thereof, and a strict profile is not required thereto.

Next, a method of processing the above substrate 1 for semiconductor device will be described with reference to FIG. 2.

First, an ingot of a silicon monocrystal is cut in round slices from a cylindrical crystal to provide a substrate 11 for semiconductor device having a prescribed thickness (numeral 11 is used to discriminate this substrate from the substrate 1 for semiconductor device to which the beveled portions $1a$ and $1b$ have been formed). Next, the beveled portions $1a$ and $1b$ are formed using a grindstone 2 shown in FIG. 2.

Figure 2:
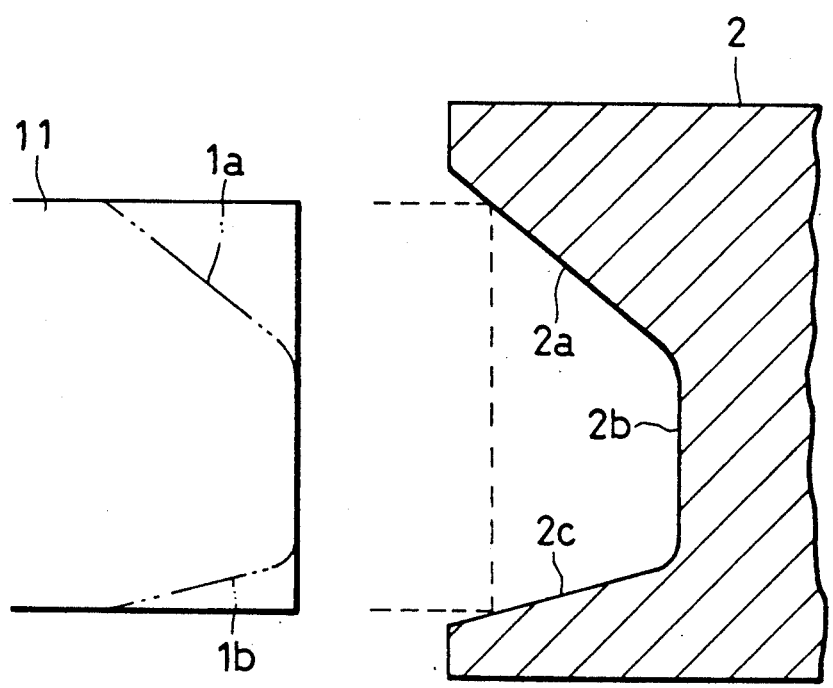
FIG. 2 is a diagram showing a substrate for semiconductor device the vicinity of the grinding surface of a grindstone used to bevel off the circumferential edge of the substrate for semiconductor device of FIG. 1.
Figure 3:
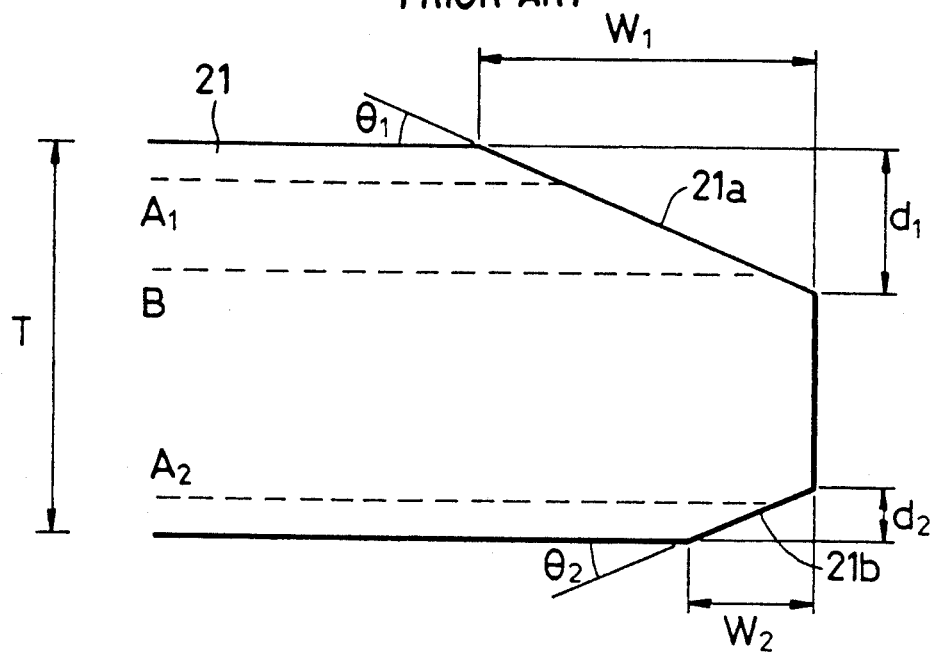
FIG. 3 is a diagram showing the circumferential portion and the vicinity thereof of an embodiment of a conventional substrate for semiconductor device.
Figure 4:
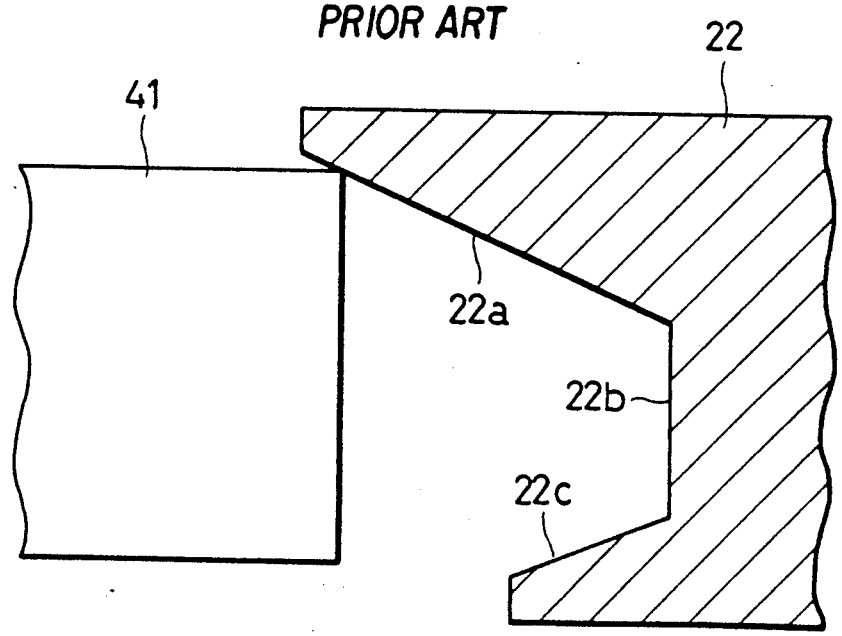
FIG. 4 is a diagram showing a substrate for semiconductor device and the vicinity of the grinding surface of a grindstone used to bevel off the circumferential edge of the substrate for semiconductor device of FIG. 3.

To describe here the grinding surfaces $2a$, $2b$, and $2c$ of the rotary grindstone 2 shown in FIG. 2, the configuration of the grinding surfaces $2a$, $2b$, and $2c$ of the grindstone 2 has a geometrical agreement with the configuration of the periphery of the substrate 1 for semiconductor device of the embodiment. More specifically, the configuration of the grinding surface $2a$, $2b$, and $2c$ of the grindstone 2 is such that the circumferential edges of the substrate 1 of the embodiment fit therewith.

When the above substrate 1 for semiconductor device is ground using this grindstone 2, the substrate 11 is gradually moved in the direction toward the rotary axis of the grindstone 2, while it is rotated in the direction opposite to that of the grindstone 2, whereby the beveled portions $1a$ and $1b$ are formed at the circumferential edges of the substrate 11.

The substrate for semiconductor device 1 of the embodiment is obtained as described above. The obtained substrate for semiconductor device 1 of the embodiment is processed, for example, as follows.

For example, the front and back surfaces of the substrate for semiconductor device 1 are lapped until they reach levels $A_1$ and $A_2$, respectively. Further, the front surface of the substrate for semiconductor device 1 is removed (half-off) until a level B is reached, and thereafter the half-off surface is polished. During the time of the course, the outermost rounded portions of the beveled portions $1a$ and $1b$ are left as they were.

The following effects can be obtained by the substrate 1 for semiconductor device of the above embodiment and the manufacturing method thereof.

According to the above substrate 1 for semiconductor device, since the angle $\theta_3$ between the inclining surface and the main surface of the front beveled portion $1a$ (the beveling angle of the front surface) is made larger than the angle $\theta_4$ between the inclining angle and the main surface of the back beveled portion $1b$ (the beveling angle of the back surface), the thickness of the tip of the periphery of the substrate for semiconductor device 1 is increased and thus the strength of the circumferential edge is increased by the increase in the thickness. As a result, the occurrence of chip-off of the substrate of semiconductor device 1 can be effectively prevented in processes the substrate encounters.

Further, the beveled portions $1a$ and $1b$ formed on the front and back surfaces has the same widths $w_3$ and $w_4$, and thus when the beveled portions $1a$ and $1b$ of the front and back surfaces are simultaneously formed using the grindstone having the grinding surfaces $2a$, $2b$, and $2c$ which will fit dimensionally the periphery of the substrate 1 for semiconductor device after it is finished, the edges of the front and back surfaces are simultaneously abutted against the grinding surfaces $2a$ and $2c$ of the grindstone 2, whereby the grinding operation thereof is simultaneously carried out and finished at both the edges. As a result, while the beveled portions $1a$ and $1b$ are ground, the pressure coming from one of the surfaces being ground is always offsetting that of the other surface being ground, whereby the occurrence of strain due to grinding and the chip-off of the substrate for semiconductor device can be prevented during the operation.

Further, according to the above manufacturing method, since the beveled portions $1a$ and $1b$ of the front and back surfaces are simultaneously formed by the grinder 2 having the grinding surfaces $2a$, $2b$, and $2c$ which is in a geometrical agreement to the profile of the circumferential edges of the substrate 1 for semiconductor device after it is finished, the edges of the front and back surfaces can be simultaneously abutted against the grinding surfaces $2a$ and $2c$ of the grindstone 2, and further the grinding operation is simultaneously carried on and finished. As a result, the occurrence of strain due to grinding and the chip-off of the substrate 1 for semiconductor device can be prevented.

Although the present invention effected by the inventor has been described above in detail with reference to the embodiment, the invention is not limited to the above embodiment, but it is obvious that various modifications can be made within the scope which do not depart from the gist of the invention.

For example, although the beveled portions $1a$ and $1b$ are flatly formed in section in the above example, one or both thereof may be formed to have a curved surface of a prescribed radii of curvature in section. In this case, the beveled portions $1a$ and $1b$ formed on both main surfaces of the substrate 1 for semiconductor device are formed by curves having different radii of curvature.

The effects provided by the typical inventions disclosed in this application will be simply described below.

According to the present invention, when a substrate for semiconductor device used for a substrate for a discrete semiconductor device is beveled, beveled portions are formed to have such a contour of the periphery of both surfaces of said substrate as a beveled depth of the surface to be removed of the substrate is made larger than that of the surface not to be removed of the substrate, and the angle between the inclining surface and the main surface of the beveled portion on the removed (front) surface is made larger than that of the beveled portion on the non-removed (back) surface, before both surfaces of the substrate for semiconductor device are subjected to diffusion or after they have been subjected thereto, so that the thickness of the tip of the beveled portions of the periphery of the substrate for semiconductor device is increased, and the strength of the circumferential edge is increased by the increase in the thickness. As a result, the occurrence of the chip-off of the substrate for semiconductor device can be effectively prevented in processes prior to, in and after a half-off process.

Further, according to the present invention, the beveled portions formed on the both main surfaces have the same width, and thus when the beveled portions of the removed and non-removed surfaces are simultaneously formed by a grindstone having the grinding surface geometrically agreeing to the profile of the periphery contour of the substrate which is formed after the substrate has been processed, the edges of the removed and non-removed surfaces are simultaneously abutted against the grinding surface of the grindstone, and the grinding operation is simultaneously carried on and finished at both the edges. As a result, the pressure originated from one of the surfaces being ground is always neutralized by the other surface being ground, whereby the occurrence of strain due to grinding and the chip-off of the substrate for semiconductor device can be prevented.

What is claimed is:

1. An improved method of processing a substrate for a semiconductor device, comprising the steps of:
    diffusing collector regions on both main surface sides of said substrate doped with an impurity at a lower concentration to form a higher concentrated impurity layer;
    beveling a front surface edge and a back surface edge of said substrate such that said front surface edge is beveled to a greater depth than said back surface edge and wherein said beveled front surface edge has a greater angle of inclination than said beveled back surface edge;
    removing substantially a half of the thickness of said substrate to expose a layer doped with said impurity at said lower concentration on a front surface of said substrate; and
    polishing said exposed lower concentrated impurity layer to provide said substrate for the semiconductor device comprising double layers of higher and lower concentrated impurities.

2. An improved method of processing a substrate for a semiconductor device according to claim 1, wherein said angle of inclination of said beveled front surface edge and said angle of inclination of said beveled back surface edge are set such that beveled widths of said front surface and back surface edges are substantially the same.

3. An improved method of processing a substrate for a semiconductor device according to claim 2, wherein said beveled front surface and back surface edges are simultaneously formed in one operation.

4. An improved method of processing a substrate for a semiconductor device according to claim 1, wherein said beveling step occurs before said diffusing step.

5. An improved method of processing a substrate for a semiconductor device according to claim 2, wherein the beveling step comprises a step of rounding a joint between the beveled front surface edge and a peripheral edge surface of said substrate and a joint between the beveled back surface edge and the peripheral edge surface of said substrate.

6. An improved method of processing a substrate for a semiconductor device according to claim 3, wherein the beveling step comprises a step of rounding a joint between the beveled front surface edge and peripheral edge surface of said substrate and a joint between the beveled back surface edge and the peripheral edge surface of said substrate.

* * * * *

UNITED STATES PATENT AND TRADEMARK OFFICE
CERTIFICATE OF CORRECTION

PATENT NO.    : 5,045,505
DATED         : September 3, 1991
INVENTOR(S)   : Hirokazu KIMURA It is certified that error appears in the above-identified patent and that said Letters Patent is hereby corrected as shown below:

Column 4, line 26, after "device" insert --and--.

Signed and Sealed this

Thirteenth Day of April, 1993

Attest:

STEPHEN G. KUNIN

*Attesting Officer*        *Acting Commissioner of Patents and Trademarks*